(12) United States Patent
Chang et al.

(10) Patent No.: US 7,176,047 B2
(45) Date of Patent: Feb. 13, 2007

(54) METHOD FOR MANUFACTURING MEMS STRUCTURES

(75) Inventors: Ming-Chih Chang, Sinyuan Township, Pingeung County (TW); H Shu Wu, Hsinchu (TW); Tsang-Mu Lai, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 403 days.

(21) Appl. No.: 10/769,346

(22) Filed: Jan. 30, 2004

(65) Prior Publication Data

US 2005/0170544 A1 Aug. 4, 2005

(51) Int. Cl.
*H01L 21/00* (2006.01)
(52) U.S. Cl. .................................. 438/52; 438/725
(58) Field of Classification Search ................. 438/48, 438/52, 53, 694, 725
See application file for complete search history.

(56) References Cited

U.S. PATENT DOCUMENTS

| | | | |
|---|---|---|---|
| 6,818,384 B2 * | 11/2004 | Choi et al. | 430/311 |
| 2002/0155389 A1 * | 10/2002 | Rangarajan et al. | 430/314 |
| 2003/0129543 A1 * | 7/2003 | Hwang et al. | 430/311 |

* cited by examiner

*Primary Examiner*—Tuan H. Nguyen
(74) *Attorney, Agent, or Firm*—Tung & Associates

(57) ABSTRACT

A method for forming a free standing micro-structural member including providing a substrate; blanket depositing a first sacrificial resist layer over the substrate; exposing and developing the first sacrificial resist layer to form a first resist portion; subjecting the first resist portion to at least a hard bake process to form the first resist portion having a predetermined first smaller volume compared to a desired final resist portion volume; blanket depositing at least a second sacrificial resist layer followed by exposure, development and the at least a hard bake process to form the final resist portion volume; and, depositing at least one structural material layer over the final resist portion.

20 Claims, 2 Drawing Sheets

---

```
┌─────────────────────────────────────────────────────────┐
│ DEPOSIT AND PATTERN 1st SAC RESIST LAYER TO FORM 1st    │
│   PREDETERMINED RESIST VOLUME PORTION SMALLER           │──301
│    THAN FINAL DESIRED RESIST VOLUME PORTION             │
└─────────────────────────────────────────────────────────┘
                              ▼
         ┌──────────────────────────────────────┐
         │  DEEP UV IRRADIATE AND HARD BAKE     │──303
         └──────────────────────────────────────┘
                              ▼
┌─────────────────────────────────────────────────────────┐
│ BLANKET DEPOSIT AT LEAST ONE ADDITIONAL SAC RESIST      │──305
│       LAYER OVER 1st SAC RESIST AND PATTERN             │
└─────────────────────────────────────────────────────────┘
                              ▼
┌─────────────────────────────────────────────────────────┐
│  DEEP UV IRRADIATE AND HARD BAKE TO FORM                │──307
│        FINAL DESIRED RESIST VOLUME PORTION              │
└─────────────────────────────────────────────────────────┘
                              ▼
┌─────────────────────────────────────────────────────────┐
│      DEPOSIT STRUCTURAL MATERIAL OVER FINAL             │──309
│              RESIST VOLUME PORTION                      │
└─────────────────────────────────────────────────────────┘
                              ▼
         ┌──────────────────────────────────────┐
         │       REMOVE RESIST TO FORM          │──311
         │   FREE-STANDING STRUCTURAL MEMBER    │
         └──────────────────────────────────────┘
```

METHOD FOR MANUFACTURING MEMS STRUCTURES

FIELD OF THE INVENTION

This invention generally relates to manufacturing micro-electro-mechanical systems (MEMS) and more particularly a method of for manufacturing MEMS structural components according to sacrificial resist patterning methods.

BACKGROUND OF THE INVENTION

Increasingly, there is a demand for the fabrication of 3-dimensional micron-scale components for micro-electro-mechanical systems (MEMS). Micro-electro-mechanical devices include structures of generally conventional shape and function, e.g., beams, posts levers, wheels, and the like, but of a size that is on the scale of hundreds of microns or smaller. As the general name implies, MEMS often incorporate electro-mechanical elements as sensors and/or actuators including optical components such as electro-mechanical mirrors and the like.

In one approach to fabricating MEMS structural components a 3-dimensional sacrificial resist mold is formed on a substrate for depositing a structural material. Generally, micro-lithographic techniques conventional in micro-integrated circuit fabrication have been used to form shaped structures on substrates. The adaptation of semiconductor manufacturing techniques has also been favored because silicon has been found to be a useful material for making MEMS.

In addition, other structural materials, such as metals, oxides and nitrides have been used for forming MEMS structural components. Generally, the approach includes successive steps of applying a sacrificial resist layer, patterning the resist layer, and forming a structure corresponding to the pattern. The MEMS structures may be formed by either etching a substrate according to the patterned resist layer or by depositing a structural material over the patterned sacrificial resist layer to form a 3-dimensional structure on the substrate surface. Successive stages of patterned deposition and etching may be used to form arrays of larger 3-dimensional MEMS structures.

A particular problem encountered in MEMS manufacture, which is not so often experienced in fabrication of semiconductor devices is the need to provide vertical dimensions and aspect ratios with greater tolerances than those commonly demanded in the fabrication of semiconductor devices. One problem in using sacrificial resists is the tendency of the sacrificial resist to shrink in volume upon curing the resist, including a hard bake process following exposure and development of the resist. As a result, the mass volume of the patterned resist is reduced, altering the critical dimensions of the patterned resist in unpredictable and uncontrollable ways and compromising the critical dimensions of the subsequently formed MEMS structure.

For example, referring to FIG. 1A, is shown a patterned resist layer portion 12 formed over substrate 10. Referring to FIG. 1B, is shown the patterned resist layer portion 12 following a curing process including a hard bake where sidewall portions e.g., 12B are recessed due to resist shrinkage. Referring to FIG. 1C, subsequent deposition of the structural forming layer 14 results in a thinned structural layer e.g., 14B along the sidewalls, resulting in a deformed structural portion compromising design constraints including mechanically weakening the overall structure.

Accordingly, there is a need in the MEMS fabrication art for an improved method to form structural components with improved dimensional accuracy and mechanical integrity including fabricating free-standing structures with high aspect ratios.

It is therefore an object of the invention to provide in the MEMS fabrication art an improved method to form structural components with improved dimensional accuracy and mechanical integrity including fabricating free-standing structures with high aspect ratios, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming a free standing microstructural member.

In a first embodiment the method includes providing a substrate; blanket depositing a first sacrificial resist layer over the substrate; exposing and developing the first sacrificial resist layer to form a first resist portion; subjecting the first resist portion to at least a hard bake process to form the first resist portion having a predetermined first smaller volume compared to a desired final resist portion volume; blanket depositing at least a second sacrificial resist layer followed by exposure, development and the at least a hard bake process to form the final resist portion volume; and, depositing at least one structural material layer over the final resist portion.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by exemplary reference to a rectangularly shaped structure including sidewall portions, it will be appreciated that the method of the present invention may be adapted to any shaped MEMS structural component where sacrificial resist layers may be advantageously used as a sacrificial mold for depositing a structural material thereover. It will additionally be appreciated that successive stages of the method of the present invention may be repeated to form a larger 3-dimensional structure including an array of 3-dimensional structures.

Figure 2A:
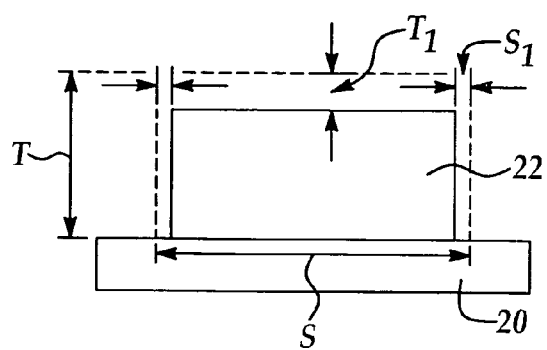
FIGS. 2A–2E are representational cross sectional views of a portion of an exemplary are representational cross sectional views of a portion of a MEMS structure at stages of manufacture according to an embodiment of the present invention.

Referring to FIG. 2A, a first sacrificial resist layer is deposited and patterned by conventional means to form a patterned first sacrificial resist layer portion 22 over substrate 20. The first sacrificial resist layer portion 22 is formed at a predetermined smaller volume dimension than the desired final resist portion volume dimension for subsequent structural material deposition thereover.

For example, the first sacrificial resist layer portion 22 is deposited by a conventional spin coating process, for example including any conventional photoresist including DUV and DNQ novolak I-line photoresist. Following spin-coating, the resist is subjected to a soft bake at a temperature range of 85° C. to about 125° C. to drive off a portion of the solvents and impart dimensional stability to the photoresist. Following the soft bake, the photoresist layer is aligned and exposed through a mask by conventional methods. Following exposure, the resist is preferably subjected to a post-exposure bake (PEB) to further drive off solvents to leave less than about 10% solvents in the resist. For deep ultra-violet (DUV) resists the PEB process is critical in order to catalyze a chemical reaction and make the resist soluble in the developer. Preferably, the PEB process is carried out from about 5° C. to about 20° C. higher than the soft-bake process.

Following the PEB process, the resist is developed by conventional process, for example using conventional tetra-methyl-ammonium-hydroxide (TMAH) containing developer formulations to leave the patterned first sacrificial resist layer portion 22.

Still referring to FIG. 2A, preferably, the first sacrificial resist layer portion 22 is patterned such that following development it is formed with a volume smaller than that of the desired final resist portion volume (thickness, width and depth dimension) from about 5% to about 50% smaller in volume, more preferably from about 10% to about 33% smaller in volume. For example in the case of a rectangular first sacrificial resist layer portion e.g., 22 the width (and depth) defining sidewall portions are formed at a smaller dimension difference value S1 compared to the final desired width (or depth) dimension S, S1 having a value of about ½ compared to the smaller thickness dimension value T1, T1 being the difference compared to the final desired thickness dimension T. For example, if the smaller dimension value T1 compared to the desired final dimension T is smaller by about 1 micron, the sidewall portions have a width (or depth) formed at a smaller dimension difference value, S1, smaller by about 0.5 microns compared to the desired final dimension S, such that the total smaller dimension difference value (2×S1) for the width and depth portions is about the same as the smaller dimension difference value T1, e.g., about 1 micron.

It will be appreciated that the smaller dimensional difference values for S1 and T1 will vary depending on the width or depth of the resist layer portion 22 and the degree of shrinkage expected following a hard bake process, for example from about 1% to about 10% of the width or depth dimension. In addition, the desired tolerances of the structural member to be formed by structural material deposition over the resist layer portion e.g., 22 following a UV/hard bake process according to an embodiment of the invention, will determine the size of the smaller dimension values as well as determining whether more than one additional sacrificial resist layer deposited over the resist layer portion 22 will be necessary to achieve desired tolerances as explained below.

Figure 2B:
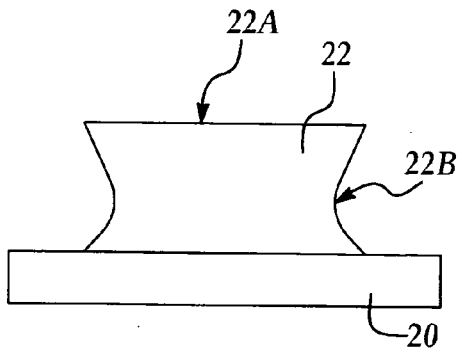

Referring to FIG. 2B, following the developing process, the first sacrificial resist layer portion 22 is subjected to at least a hard bake process, more preferably both a UV exposure, preferably deep UV (e.g., less than about 350 nm), and a subsequent or simultaneous hard bake process from about 250° C. to about 350° C. For example, exposure to UV, preferably deep UV, promotes polymeric cross-linking reactions at the surface of the resist, forming a hardened resist shell (surface portion) thereby preventing distortion of at least the UV exposed portion while allowing a higher hard bake temperature without causing flowing and distortion of the resist portion, e.g., upper surface portion 22A. The higher temperature tolerance to resist flow is important in subsequent structural material layer deposition over the sacrificial resist layer portions as deposition temperatures can reach up to about 200° C.

Nevertheless, as seen in FIG. 2B, the sidewall portions e.g., 22B, of the first sacrificial resist layer portion 22 tend to 'cave in' due to volume (mass) loss (shrinkage) caused by volatization of a remaining portion of solvents present in the resist and limited hardened shell development at the sidewall portions due to limited deep UV exposure.

In one embodiment, the hard bake (thermal heating) step is carried out following a deep UV exposure step, or simultaneously with at least a portion of the deep UV exposure step step. The s application of polymeric cross-linking inducing irradiant energy (e.g. deep UV irradiation) during at least a portion of the heating step, for example, initiating UV irradiation either prior to or following initiating of the heating step, preferably prior to initiation of the heating step can be optimized to allow partial outgassing prior to formation of the hardened resist shell at the resist surface thereby preventing undesired localized swelling of resist portions or bursting of resist bubbles formed during resist outgassing. Optionally, the resist temperature may be ramped up to a baking temperature at about 10° C./min to about 30° C./min, preferably a baking temperatures from about 250° C. to about 350° C. following or at least partially simultaneously with irradiation of the resist with deep UV light. Alternatively, the resist portion may be first subjected to deep UV irradiation for a predetermined period followed by heating (hard baking) the resist layer at the baking temperature, for example from about 10 minutes to about 60 minutes.

Figure 2C:
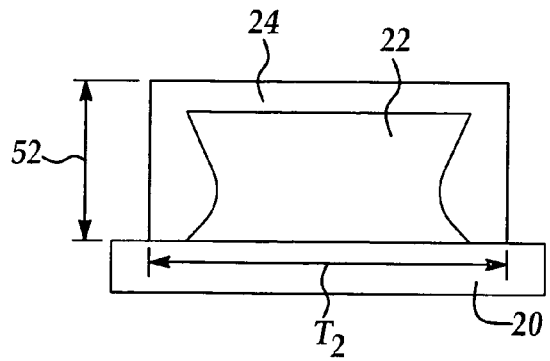

Referring to FIG. 2C, following the UV/hard bake process, at least a second sacrificial resist layer portion 24 is deposited over the first sacrificial resist layer portion 22. The same sequence of processes is then followed as outlined for the first sacrificial resist layer portion 22, e.g., soft bake, exposure, PEB, development, and UV/hard bake processes. For example in one embodiment, the second sacrificial resist layer portion 24 is deposited to a thickness such that following the UV/hard bake processes, the volume or dimensional values e.g., S2 and T2 of the second sacrificial resist layer portion 24 together with the first sacrificial resist layer portion 22 together make up a desired final resist portion dimension or volume.

In another embodiment, the second sacrificial resist layer portion 24 may be formed such that following the same processes as for the first sacrificial resist layer portion 24, e.g., soft bake, exposure, PEB, development, and UV/hard bake, the resist portion has dimensions that remain smaller than the desired final resist portion dimensions or volume, for example making up about ½ of the difference between the final desired dimensions and the first sacrificial resist layer portion 22 dimensions. Thereafter, the process is repeated with deposition of a subsequent, e.g., third sacrificial resist layer portion (not shown) with the same processing steps to make up a final desired resist portion dimension or volume following a UV/hard bake process.

Since the formation of a hardened shell at the resist portion surfaces from UV exposure may be not fully effective on the sidewall portions due to light shadowing effects of adjacent resist portions (not shown), a degree of resist shrinkage along the sidewall portions of the subsequently deposited resist layer portions e.g., 24 will occur following a hard bake process, for example, from about 1% to about 7%. Depending on the thickness of a subsequent sacrificial resist layer to be deposited to approach a desired final resist portion volume and the desired dimensional tolerances desired for the subsequent structural material layer to be deposited, the subsequent sacrificial resist layer (e.g., second sacrificial resist layer e.g., 24) may desirably be deposited to a thickness with a dimensional volume smaller than the desired final resist portion dimensional volume. Following a hard bake process, a subsequent sacrificial resist layer (e.g., third sacrificial resist layer) is deposited over the second sacrificial layer portion e.g., 24 and subjected to the same processes, e.g., soft bake, exposure, PEB, development, and UV/hard bake, to achieve a desired final resist portion dimension or volume.

Figure 2D:
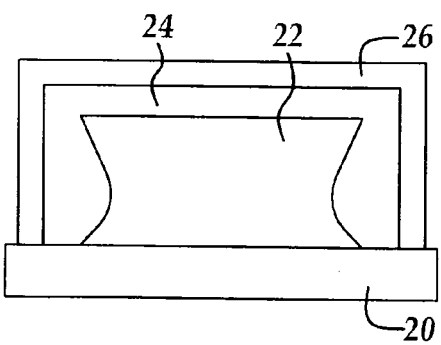

Referring to FIG. 2D, following formation of the resist layer portions e.g., 22 and 24, to reach a desired final resist portion volume, a blanket deposition process is carried out to deposit a structural material layer 26 over the last deposited resist layer e.g., 24. For example the structural material layer 26 may be any structural material used for MEMS structures including single or multiple layers of metals, metal nitrides, refractory metals, refractory metal nitrides, oxides, carbides, and piezo-electric oxides such as PZT, a solid solution of lead titanate and lead zirconate e.g., (Pb (Ti, Zr)$O_3$. For example, the structural material layer 26 is preferably deposited at a temperature lower than a softening point of the resist layer portion, for example about 210° C. For example, a low temperature CVD or PECVD processes using organo-metallic precursors or physical vapor deposition (PVD) processes process may be used where the deposition rate is controlled to keep the heating of the photoresist layer below a softening point. In addition, an electrochemical plating (ECP) process preceded by PVD deposition of a seed layer may suitably be used to deposit a metal. The thickness of the structural material layer 26 will of course depend on the structure formed, for example considerations of strength, stiffness and resonant frequency will typically dictate the desired thickness of the structural material layer 26.

Figure 2E:
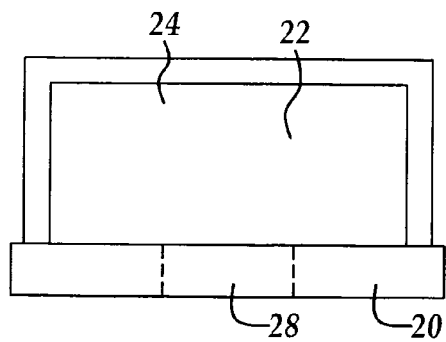

Referring to FIG. 2E, following deposition of the structural material layer 26, an opening may be formed to expose a portion of the resist layer portion e.g., 22 And 24, for example the substrate 20, e.g., silicon, may be etched through from the backside to form a backside opening portion e.g., 28. A resist removal process, preferably an oxygen containing ashing process is then used to remove the resist layer portions e.g., 22 and 24 to leave a free standing structural member 26. For example an oxygen ashing process may be used alone or in conjunction with a conventional wet stripping process as is known in the art of integrated circuit manufacturing.

Figure 1A:
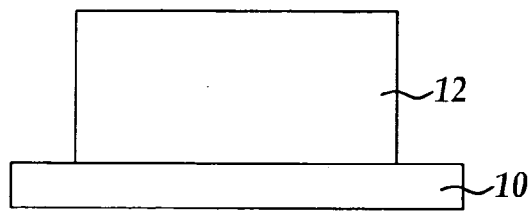
FIGS. 1A–1C are representational cross sectional views of a portion of a MEMS structure at stages of manufacture according to the prior art.
Figure 1B:
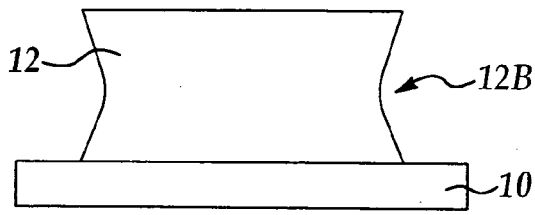
Figure 1C:
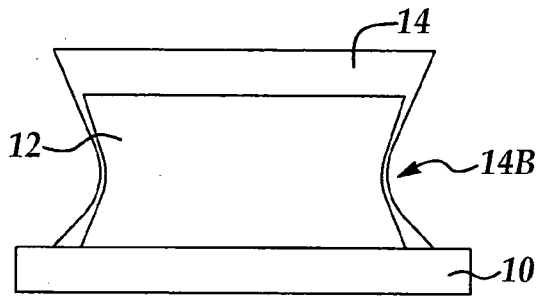
Figure 3:
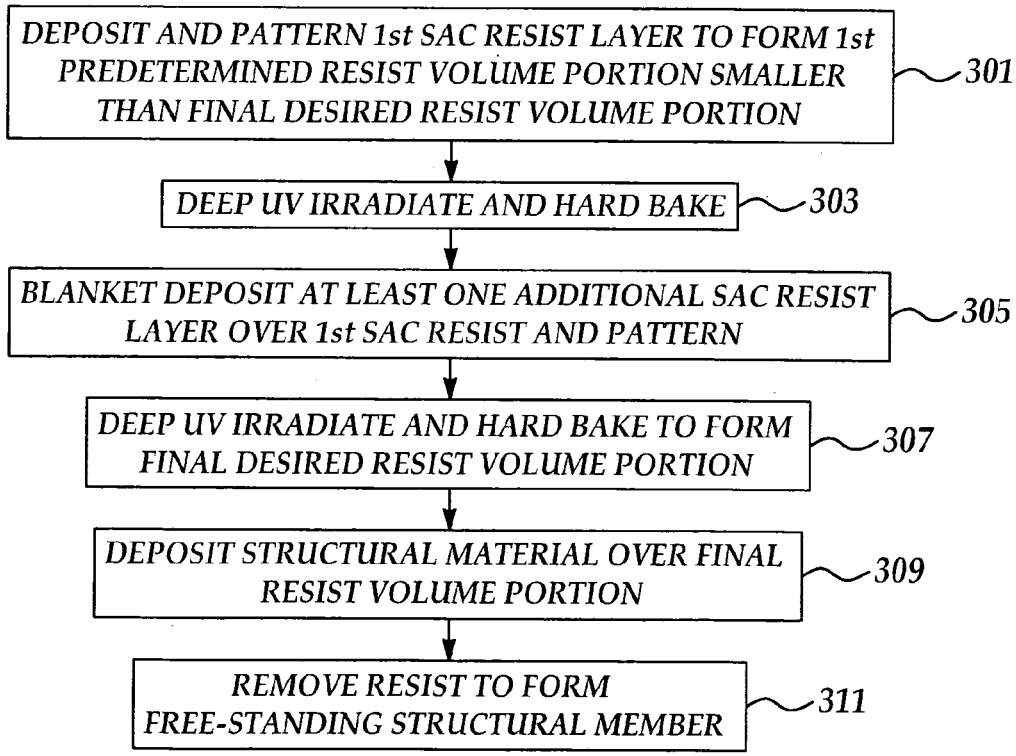
FIG. 3 is a process flow diagram including several embodiments of the present invention.

Referring to FIG. 3 is a process flow diagram including several embodiments of the method of the present invention. In process 301, a first sacrificial resist layer is blanket deposited over a substrate and patterned to form a first resist volume portion having a smaller dimension (volume) than a final desired dimension (volume). In process 303, the first resist volume portion is subjected to irradiant energy (e.g., deep UV) to induce polymeric cross-linking and thermal heating (hard bake) inducing resist volume shrinkage and hardening. In process 305, at least one additional (subsequent) sacrificial resist layer is blanket deposited over the first resist volume portion and patterned to approach or reach a predetermined (final) total resist volume portion. In process 307 the subsequent resist volume portion is subjected to a subsequent irradiant energy (e.g., deep UV)/thermal heating (hard bake) step to achieve a predetermined desired resist volume portion (dimension). In process 309, at least one layer of a structural material is blanket deposited over the resist layer portion. In process 311, the resist portion is removed to leave a free-standing structural material portion.

Thus, a method has been presented for forming freestanding structural portions to desired dimensional constraints by using at least two sacrificial resist layers to form a resist portion (mold) for subsequent structural material deposition thereover thereby reducing the dimensional variations in the structural portions due to resist shrinkage in a resist patterning and curing process. As a result, freestanding structures, including MEMS structures may be formed to tighter dimensional tolerances with improved structural and mechanical integrity.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a free standing micro-structural member comprising the steps of:
   providing a substrate;
   forming a first sacrificial resist layer over the substrate;
   patterning the first sacrificial resist layer to form a first resist portion;
   subjecting the first resist portion to at least a first hard bake process to form the first resist portion having a first volume;
   forming at least a second sacrificial resist layer on a top surface of said first resist portion followed by patterning and conducting at least a second hard bake process to form a final resist portion having a final volume;
   depositing at least one structural material layer over the final resist portion; and
   removing said final resist portion.

2. The method of claim 1, wherein the at least a first hard bake process further comprises one of a prior exposure or at least partially simultaneous exposure to polymeric cross-linking inducing radiant energy.

3. The method of claim 2, wherein the radiant energy comprises ultraviolet light having a wavelength of less than about 350 nm.

4. The method of claim 3, wherein the ultraviolet light further comprises a radiation intensity between 50 mJ/$cm^2$ and 200 mJ/$cm^2$, a radiation temperature between 150° C. and 250° C., and a radiation time between 10 and 60 minutes.

5. The method of claim 2, wherein exposure to the polymeric cross-linking inducing radiant energy is carried out prior to the first or second hard bake step comprising a thermal heating step.

6. The method of claim 2, wherein exposure to the polymeric cross-linking inducing radiant energy is carried out at least during a portion of the first or second hard bake process.

7. The method of claim 1, wherein the first or second hard bake process comprises a baking temperature of from about 250° C. to about 350° C.

8. The method of claim 1, wherein the first smaller volume is compared to the final resist portion volume by about 5% to about 50%.

9. The method of claim 1, further comprising the step of removing resist comprising the final resist portion according to at least one of an ashing process and a wet stripping process to form a free-standing structural member.

10. The method of claim 1, wherein the structural material is selected from the group consisting of metals, nitrides, oxides, carbides, and titanates.

11. The method of claim 1, wherein the structural material is selected from the group consisting of metals, metal nitrides, refractory metals, refractory metal nitrides, oxides, carbides, and piezo-electric oxides.

12. A method for forming a free standing micro-structural member comprising the steps of:
providing a substrate;
forming a first sacrificial resist layer over the substrate;
patterning the first sacrificial resist layer to form a first resist portion;
subjecting the first resist portion to at least a first post treatment process to form the first resist portion having a first volume;
forming at least a second sacrificial resist layer on a top surface of said first resist portion followed by patterning and conducting at least a second post treatment process to form a final resist portion having a final volume;
depositing at least one structural material layer over the final resist portion; and
removing said final resist portion.

13. A method for forming a free standing micro-structural member over a resist portion with improved dimensional tolerances comprising the steps of:
providing a substrate;
forming a first resist layer over the substrate;
patterning the first resist layer to form a first resist portion having a predetermined first volume smaller compared to a predetermined final resist portion volume;
subjecting the first resist portion to a first curing process comprising deep UV irradiation and thermal heating for a predetermined period to harden the first resist portion;
forming at least a second resist layer having a predetermined thickness over the first resist portion followed by patterning and a second curing process to form the final resist portion volume;
depositing at least one structural material layer over the final resist portion; and,
removing the final resist portion according to at least one of an ashing and a wet stripping process to form a free standing structural member.

14. The method of claim 13, wherein the first and second curing processes comprise exposure to a deep UV irradiation prior to a thermal heating period.

15. The method of claim 13, wherein the thermal heating period comprises a temperature of from about 250° C. to about 350° C.

16. The method of claim 14, wherein the first and second curing processes comprise exposure to a deep UV irradiation during at least a portion of a thermal heating period.

17. The method of claim 13, wherein the first volume is smaller compared to the final resist portion volume by about 5% to about 50%.

18. The method of claim 13, wherein the first volume is smaller compared to the final resist portion volume from about 10% to about 33%.

19. The method of claim 13, wherein the first volume comprises sidewall portions formed having a smaller dimension by a factor of about ½ compared to a smaller thickness dimension.

20. The method of claim 13, wherein the structural material is selected from the group consisting of metals, metal nitrides, refractory metals, refractory metal nitrides, oxides, carbides, and metal titanates.

* * * * *